(12) United States Patent
Cheng et al.

(10) Patent No.: US 10,795,882 B2
(45) Date of Patent: Oct. 6, 2020

(54) BLOCKCHAIN-BASED DATA COMPRESSION AND SEARCHING

(71) Applicant: Alibaba Group Holding Limited, George Town (KY)

(72) Inventors: Long Cheng, Hangzhou (CN); Yanpeng Li, Hangzhou (CN); Boyan Jia, Hangzhou (CN)

(73) Assignee: Alibaba Group Holding Limited, George Town, Grand Cayman (KY)

( * ) Notice: Subject to any disclaimer, the term of this patent is extended or adjusted under 35 U.S.C. 154(b) by 0 days.

(21) Appl. No.: 16/786,794

(22) Filed: Feb. 10, 2020

(65) Prior Publication Data

US 2020/0175002 A1 Jun. 4, 2020

Related U.S. Application Data

(63) Continuation of application No. PCT/CN2020/072133, filed on Jan. 15, 2020.

(30) Foreign Application Priority Data

Apr. 30, 2019 (CN) .......................... 2019 1 0363442

(51) Int. Cl.
*G06F 16/23* (2019.01)
*G06F 16/25* (2019.01)
(Continued)

(52) U.S. Cl.
CPC ........ *G06F 16/2379* (2019.01); *G06F 16/245* (2019.01); *G06F 16/258* (2019.01); *H03M 7/30* (2013.01); *G06Q 10/10* (2013.01)

(58) Field of Classification Search
CPC .... G06F 16/2379; G06F 16/27; G06F 21/602; G06F 16/1805; G06F 21/64;
(Continued)

(56) References Cited

U.S. PATENT DOCUMENTS 10,181,948 B1 1/2019 Nenov et al.
2016/0283920 A1* 9/2016 Fisher .................. H04L 9/3297
(Continued)

FOREIGN PATENT DOCUMENTS

CN 106326641 1/2017
CN 107728941 2/2018
(Continued)

OTHER PUBLICATIONS

Crosby et al., "BlockChain Technology: Beyond Bitcoin," Sutardja Center for Entrepreneurship & Technology Technical Report, Oct. 16, 2015, 35 pages.
(Continued)

*Primary Examiner* — Angelica Ruiz
(74) *Attorney, Agent, or Firm* — Fish & Richardson P.C.

(57) ABSTRACT

A computer-implemented method includes: compressing, by a service party, target data to be stored according to a preset compression template; assembling the compressed target data and a unique identifier of the preset compression template into storage transaction data; and transmitting the storage transaction data to a node device on a blockchain, so that the node device, in response to the storage transaction data, searches for a smart contract published on the blockchain, in which the smart contract corresponds to the unique identifier, invokes the preset compression template to determine that a data format of the target data conforms to a data format specified by the preset compression template, and in response to determining that the data format of the target data conforms to the data format specified by the preset compression template, stores the compressed target data.

18 Claims, 10 Drawing Sheets

(51) Int. Cl.
*H03M 7/30* (2006.01)
*G06F 16/245* (2019.01)
*G06Q 10/10* (2012.01)

(58) Field of Classification Search
CPC .... G06F 16/2365; G06F 21/645; G06F 21/62;
G06F 21/57; G06F 16/93; G06F 17/18;
G06F 21/31; G06F 21/45
USPC .......... 707/600–831, 899, 999.001–999.206
See application file for complete search history.

(56) References Cited

U.S. PATENT DOCUMENTS

| | | | |
|---|---|---|---|
| 2017/0149560 A1* | 5/2017 | Shah | G06K 7/1417 |
| 2017/0232300 A1* | 8/2017 | Tran | G06F 3/017 |
| | | | 434/247 |
| 2018/0129797 A1* | 5/2018 | Rush | H04L 63/0861 |
| 2018/0129958 A1* | 5/2018 | Saxena | G06F 16/9024 |
| 2018/0157825 A1* | 6/2018 | Eksten | G06F 21/64 |
| 2018/0255381 A1* | 9/2018 | Cella | H04W 84/18 |
| 2018/0329693 A1* | 11/2018 | Eksten | G06F 16/21 |
| 2019/0065456 A1* | 2/2019 | Platow | G06F 40/174 |
| 2019/0377461 A1* | 12/2019 | Akhanov | G06F 3/0482 |
| 2020/0099511 A1* | 3/2020 | Jarry-Lacombe | H04L 9/0631 |

FOREIGN PATENT DOCUMENTS

| | | |
|---|---|---|
| CN | 107944868 | 4/2018 |
| CN | 108156173 | 6/2018 |
| CN | 108256354 | 7/2018 |
| CN | 108563796 | 9/2018 |
| CN | 109067541 | 12/2018 |
| CN | 109274377 | 1/2019 |
| CN | 109615383 | 4/2019 |
| CN | 109615517 | 4/2019 |
| CN | 110163755 | 8/2019 |

OTHER PUBLICATIONS

Nakamoto, "Bitcoin: A Peer-to-Peer Electronic Cash System," www.bitcoin.org, 2005, 9 pages.

Hao-sen et al., "Compression optimization of XML data stream in community correction communication system", Information Technology, Feb. 2018, 6 pages (with English Abstract).

Heping et al., "Xcfde: A XML Compression with High Compression Ratio", Huazhong University of Science and Technology, Feb. 29, 2007, 4 pages (with English Abstract).

PCT International Search Report and Written Opinion in International Application No. PCT/CN2020/072133, dated Apr. 13, 2020, 15 pages (with partial machine translation).

* cited by examiner

BLOCKCHAIN-BASED DATA COMPRESSION AND SEARCHING

CROSS-REFERENCE TO RELATED APPLICATIONS

This application is a continuation of PCT Application No. PCT/CN2020/072133, filed on Jan. 15, 2020, which claims priority to Chinese Patent Application No. 201910363442.5, filed on Apr. 30, 2019, and each application is hereby incorporated by reference in its entirety.

TECHNICAL FIELD

Embodiments of the present disclosure relate to the field of blockchain technology, and in particular, to blockchain-based data compression and searching methods, apparatuses, and an electronic device.

BACKGROUND

Blockchain technology, also known as distributed ledger technology, is an emerging technology in which several computing devices jointly participate in "accounting" and maintain a complete distributed database. Because the blockchain technology has the characteristics of decentralization, openness and transparency, participability of each computing device in database records, and rapid data synchronization between computing devices, the blockchain technology may be widely used in many fields.

SUMMARY

The embodiments of the present disclosure provide blockchain-based data compression and searching methods, apparatuses, and an electronic device.

According to a first aspect of the embodiments of the present disclosure, there is provided a blockchain-based data compression method, including: compressing, by a service party, target data to be stored according to a preset compression template; assembling the compressed target data and a unique identifier of the compression template into a storage transaction; and transmitting the storage transaction to a node device on a blockchain, so that the node device, in response to the storage transaction, searches for a smart contract that is corresponding to the unique identifier and that is published on the blockchain, invokes a compression template declared in the smart contract to verify a data format of the target data, and if the verification is passed, stores the target data.

In some embodiments, compressing the target data to be stored according to the preset compression template includes: determining a data structure of the target data; and compressing the target data according to a compression template corresponding to the data structure.

In some embodiments, the data structure of the target data includes a self-describing structure and substance data, wherein the self-describing structure is configured to represent a meaning expressed by the substance data. A compression rule of the self-describing structure can be recorded in the compression template. Compressing the target data can include: mapping the self-describing structure of the target data into self-defining data according to the compression rule, wherein an amount of the self-defining data is smaller than a data amount of the self-describing structure.

In some embodiments, the method further includes: assembling the compression template into creation transaction of a smart contract; transmitting the creation transaction to the node device on the blockchain, so that the node device, in response to the creation transaction, invokes a smart contract audit logic declared in a smart audit contract published on the blockchain, writes a voting event in a transaction log, and after an audit node on the blockchain monitors the voting event, submits a voting transaction to the smart audit contract. The smart audit contract summarizes the voting transaction to acquire an audit result of the smart contract.

In some embodiments, the method further includes: if the audit result is passing, creating the smart contract on the blockchain, and returning the unique identifier of the smart contract to the service party.

In some embodiments, the unique identifier includes: a hash value acquired by performing a hash calculation on a unique content of the compression template declared in the smart contract.

According to a second aspect of the embodiments of the present disclosure, there is provided a blockchain-based data compression method, including: receiving, by a node device on a blockchain, a storage transaction submitted by a service party, wherein the storage transaction includes a unique identifier, and target data to be stored, which is compressed through a compression template corresponding to the unique identifier; in response to the storage transaction, searching for a smart contract that is corresponding to the unique identifier and that is published on the blockchain, invoking a compression template declared in the smart contract to verify a data format of the target data, and if the verification is passed, storing the target data.

In some embodiments, the method further includes: receiving, from the service party, creation transaction of a smart contract into which the compression template is assembled; in response to the creation transaction, invoking a smart contract audit logic declared in a smart audit contract published on the blockchain, writing a voting event in a transaction log, and after an audit node on the blockchain monitors the voting event, submitting a voting transaction to the smart audit contract; summarizing, by the smart audit contract, the voting transaction to acquire an audit result of the smart contract.

In some embodiments, the method further includes: if the audit result is passing, creating the smart contract on the blockchain, and returning the unique identifier of the smart contract to the service party.

In some embodiments, the unique identifier includes: a hash value acquired by performing a hash calculation on a unique content of the compression template declared in the smart contract.

According to a third aspect of the embodiments of the present disclosure, there is provided a blockchain-based data searching method, wherein data stored on a blockchain is data compressed based on the blockchain-based data compression method as described above. The method includes: with respect to data to be searched, assembling, by a service party, a unique identifier into a search transaction; transmitting the search transaction to a node device on the blockchain, so that the node device, in response to the search transaction, searches for the compressed data stored on the blockchain, searches for a smart contract that is corresponding to the unique identifier and that is published on the blockchain, and invokes a compression template declared in the smart contract to restore the compressed data into complete data; receiving the complete data returned by the node device.

In some embodiments, the compression template records a compression rule of a self-describing structure. Restoring the compressed data into the complete data includes: mapping self-defining data in the compressed data into the self-describing structure according to the compression rule, wherein an amount of the self-defining data is smaller than a data amount of the self-describing structure.

According to a fourth aspect of the embodiments of the present disclosure, there is provided a blockchain-based data searching method, wherein data stored on a blockchain is data compressed based on the blockchain-based data compression method as described above. The method includes: receiving, by a node device on the blockchain, a search transaction submitted by a service party, wherein the search transaction includes a unique identifier; in response to the search transaction, searching for the compressed data stored on the blockchain; searching for a smart contract that is corresponding to the unique identifier and that is published on the blockchain, and invoking a compression template declared in the smart contract to restore the compressed data into complete data; returning the complete data to the service party.

In some embodiments, the compression template records a compression rule of a self-describing structure. Restoring the compressed data into the complete data can include: mapping self-defining data in the compressed data into the self-describing structure according to the compression rule, wherein an amount of the self-defining data is smaller than a data amount of the self-describing structure.

According to a fifth aspect of the embodiments of the present disclosure, there is provided an electronic device, including: a processor; and a memory for storing processor executable instructions; wherein the processor is configured to implement any of the blockchain-based data compression methods as described above.

According to a sixth aspect of the embodiments of the present disclosure, there is provided an electronic device, including: a processor; and a memory for storing processor executable instructions; wherein the processor is configured to implement any of the blockchain-based data searching methods as described above.

Some embodiments of the present disclosure provide a blockchain-based data compression solution. The service party locally compresses the target data to be stored based on the compression template. Corresponding node device on the blockchain verifies the compressed data based on the smart contract corresponding to the compression template to ensure that the compressed data to be stored meets the requirement of the data format, thereby avoiding abnormal data such as garbled and misaligned data. In this way, through the compression template and the constraint of the smart contract to the format, data is compressed from a data source to reduce the amount of data. Further, there is also provided a blockchain-based data searching solution. When the node device on the blockchain receives the search transaction from the service party, since the data stored on the blockchain is compressed data, it is possible to restore the compressed data into the complete data based on the compression template declared in the smart contract. In this way, the compressed data stored is restored, based on the compression template declared in the smart contract, into the complete data and provided to the service party to ensure data correctness.

DETAILED DESCRIPTION OF THE EMBODIMENTS

Figure 1:
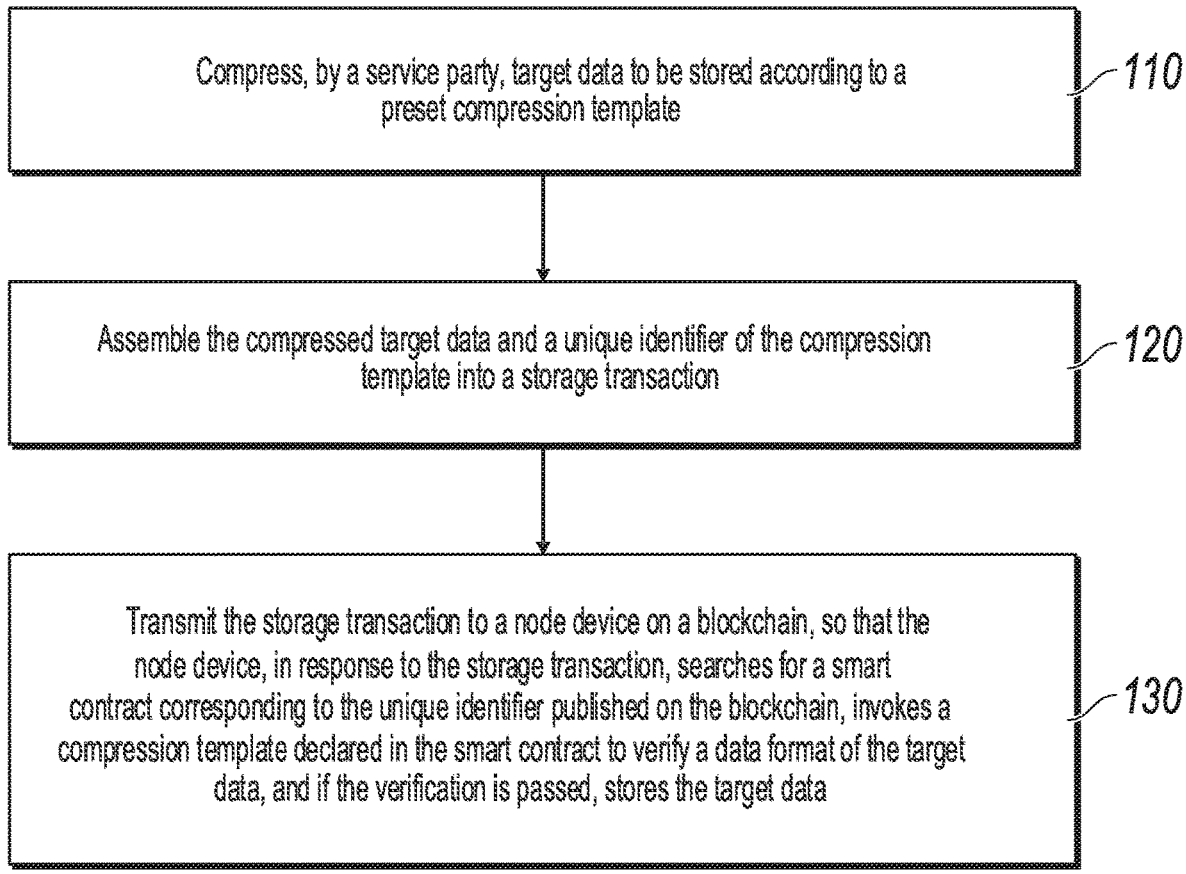
FIG. 1 is a flowchart illustrating a blockchain-based data compression method according to an embodiment of the present disclosure.

Embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present disclosure to describe various information, such information should not be limited to these terms. These terms are only used to distinguish one category of information from another. For example, without departing from the scope of the present disclosure, first information may be referred as second information. Similarly, second information may also be referred as first information. Depending on the context, the word "if" as used herein may be interpreted as "when" or "upon" or "in response to determining".

The blockchain-based traceability storage scenario is now one of the most widely used scenarios for blockchain technology. Tamper resistance, traceability, fairness and justice of data storage and other features of the blockchain technology enable traceable data stored to have credibility and to be thereby widely used in the industry. However, because blockchain includes a plurality of node devices each having its own data ledger, that is, a copy of data stored may be copied and stored by the plurality of node devices, with an increased amount of data stored for transactions, data stored on the entire blockchain will be increased even doubly, so a lot of storage resources and network overhead will be consumed.

In some cases, existing on-chain data stored are usually stored on-chain in form of a data structure such as xml, json, and other data structures. This data structure has the advantage of a self-describing structure. The self-describing structure has the advantage of showing a meaning expressed by data, but the self-describing structure takes up a lot of storage space.

The storage resources and network resources of the blockchain are not unlimited. Therefore, how to ensure the realization of transaction requirements and save resource costs has become a problem urgently to be solved.

Some embodiments of the present disclosure provide a blockchain-based data compression solution. The service party locally compresses the target data to be stored based on a compression template. Corresponding node device on the blockchain verifies the compressed data based on a smart contract corresponding to the compression template to ensure that the compressed data to be stored meets the requirement of the data format, thereby avoiding abnormal data such as garbled and misaligned data. In this way, through the compression template and the constraint of the smart contract to the format, data is compressed from a data source to reduce the amount of data. Further, there is also provided a blockchain-based data searching solution. When the node device on the blockchain receives a search transaction from the service party, since the data stored on the blockchain is compressed data, it is possible to restore the compressed data into the complete data based on the compression template declared in the smart contract. In this way, based on the compression template declared in the smart contract, the compressed data stored is restored into the complete data and provided to the service party to ensure data correctness.

The blockchain described in this disclosure may include a private blockchain, a public blockchain, a consortium blockchain, etc., and is not particularly limited in the disclosure.

For example, in a scenario, the blockchain may be a consortium blockchain consisting of a service system, an audit system, a publicity system, etc. as consortium members. The operator of the consortium blockchain may rely on the consortium blockchain to deploy the data compression storage service. The service system, the audit system, the publicity system, etc. as the consortium members described above may be used as service nodes of the data compression storage service. Each service node may publish compressed data-related information generated by itself or received in form of transaction in the consortium blockchain. After the transaction has been consensus-processed by consensus nodes on the consortium blockchain, transaction information is stored in a distributed database of the consortium blockchain to complete the "on-chain" storage of the logistic test result.

It should be noted that the transaction described in this disclosure refers to data created by a service party through a client of the blockchain and required to be finally published in the distributed database of the blockchain.

Transactions in the blockchain are usually divided into transactions in a narrow sense and transactions in a broad sense. The transaction in a narrow sense refers to a value transfer published by the service party to the blockchain. For example, in a traditional Bitcoin blockchain network, a transaction may be a bank transfer initiated by the service party in the blockchain. The transaction in a broad sense refers to service data with a transaction intention published by the service party to the blockchain. For example, the operator may build a consortium blockchain based on actual transaction needs and rely on the consortium blockchain to deploy some other types of online transaction that are not related to value transfer, such as the storage, searching and processing of service data, etc. In this type of consortium blockchain, a transaction may be a service message or a service request with a transaction intention published by the service party in the consortium blockchain.

The client may include any type of upper-layer applications that use underlying transaction data stored in the blockchain as data support to implement specific service functions.

The smart contract is a computer protocol intended to be deployed on a blockchain and applied to propagate, verify, or execute the contract in a digital manner. By declaring a service logic in the smart contract, corresponding operation may be performed. The smart contract allows trusted transactions without a third party. These transactions are traceable and irreversible. Smart contracts may provide security superior to traditional contract methods and reduce other transaction costs associated with the contracts.

The solutions provided in this disclosure are mainly divided into two parts: data compression and storage; and compressed data search.

FIG. 1 is a flowchart illustrating a blockchain-based data compression method according to an embodiment of the present disclosure. The method is applied to a service party, and may include the following steps.

At step 110, the service party compresses target data to be stored according to a preset compression template.

At step 120, the compressed target data and a unique identifier of the compression template are assembled into a storage transaction.

At step 130, the storage transaction is transmitted to a node device on a blockchain. The node device, in response to the storage transaction, searches for a smart contract that is corresponding to the unique identifier and that is published on the blockchain, invokes a compression template declared in the smart contract to verify a data format of the target data, and if the verification is passed, stores the target data.

It is worth mentioning that the smart contract corresponding to the unique identifier on the blockchain is pre-published by any service party on the blockchain. Details are as shown in the following steps.

At step A1, the compression template is assembled into a creation transaction of a smart contract.

At step A2, the creation transaction is transmitted to the node device on the blockchain. The node device, in response to the creation transaction, invokes a smart contract audit logic declared in an audit smart contract published on the blockchain, writes a voting event in a transaction log, and after an audit node on the blockchain monitors the voting event, submits a voting transaction to the smart audit contract. The smart audit contract summarizes the voting transaction to acquire an audit result of the smart contract.

In this example, the service party may create a smart contract for verifying service data, and the smart contract is formed based on the compression template.

Generally, the smart contract can conform to smart contract specifications. Therefore, for the node device, the smart contract submitted by the service party may be examined. In some embodiments, the smart contract audit logic declared in the smart audit contract published on the blockchain is invoked, the voting event is written in the transaction log, and after the audit node on the blockchain monitors the voting event, the voting transaction is submitted to the smart audit contract. The smart audit contract summarizes the voting transaction to acquire the audit result of the smart contract.

If the audit result is passing, the smart contract for data compression verification submitted by the service party is created. The blockchain may generate a unique identifier corresponding to the smart contract. That is, there is a one-to-one correspondence between the unique identifier and the smart contract.

In an example, the unique identifier may refer to a hash value acquired by performing a hash calculation on a unique content of the compression template declared in the smart contract. The hash value is also used as a smart contract address for storing the smart contract.

In addition to the hash value, any other identifier that has uniqueness may be also used as the unique identifier. For example, sequentially increasing IDs may be used for identification. For example, starting from ID=0, each time a smart contract is created, 1 is added to an initial ID as a unique identifier of the newly created smart contract.

As mentioned above, the service party may receive the unique identifier allocated by the blockchain in addition to publishing the smart contract corresponding to the compression template. This unique identifier may not only correspond to the smart contract on the blockchain, but also to the local compression template of the service party. That is, there is a one-to-one correspondence between the unique identifier and the compression template.

In an example, different compression templates are used to compress service data with different data structures. Therefore, the step 110 of compressing the target data to be stored according to the preset compression template may include: determining a data structure of the target data to be stored; and compressing the target data according to a compression template corresponding to the data structure.

For example, assuming that the target data belongs to an XML data structure, the service party may use an XML compression template to compress the target data.

If the target data belongs to a JSON data structure, the service party may use a JSON compression template to compress the target data.

In an example, the data structure of the target data includes a self-describing structure and substance data. The self-describing structure is configured to represent a meaning expressed by the substance data. A compression rule of the self-describing structure is recorded in the compression template. Compressing the target data includes: mapping the self-describing structure of the target data into self-defining data according to the compression rule. An amount of the self-defining data is smaller than a data amount of the self-describing structure.

For example, the XML data structure is characterized by "/*/" as the self-describing structure, wherein "*" is a content which describes the meaning of the substance data, for example, /username/ ZhangSan. It can be determined from /username/ that "ZhangSan" indicates a user name.

Similarly, the JSON data structure is characterized by "*:" as a self-describing structure, wherein "*" is a content which describes the meaning of the substance data, for example, username: ZhangSan. It can be determined from username: that "ZhangSan" indicates a user name.

No matter what kind of data structure, the mapping relationship between each self-describing structure and the self-defining data may be predefined in a corresponding compression template. Therefore, the service party may map the self-describing structure of the target data into the self-defining data according to the compression rule, wherein the amount of the self-defining data is smaller than the data amount of the self-describing structure.

For example, for the target data: /username/ ZhangSan, since the data structure of the target data is an XML data structure, if it is defined in the XML compression template that the /username/ is mapped to "1", the compressed target data will be changed to: 1 ZhangSan. It can be known that the amount of the target data has been greatly reduced after compression compared to that before compression.

Some embodiments of this disclosure provide a blockchain-based data compression solution. The service party locally compresses the target data to be stored based on the compression template. Corresponding node device on the blockchain verifies the compressed data based on the smart contract corresponding to the compression template to ensure that the compressed data to be stored meets the requirement of the data format, thereby avoiding abnormal data such as garbled and misaligned data. In this way, through the compression template and the constraint of the smart contract to the format, data is compressed from a data source to reduce the amount of data.

Figure 2:
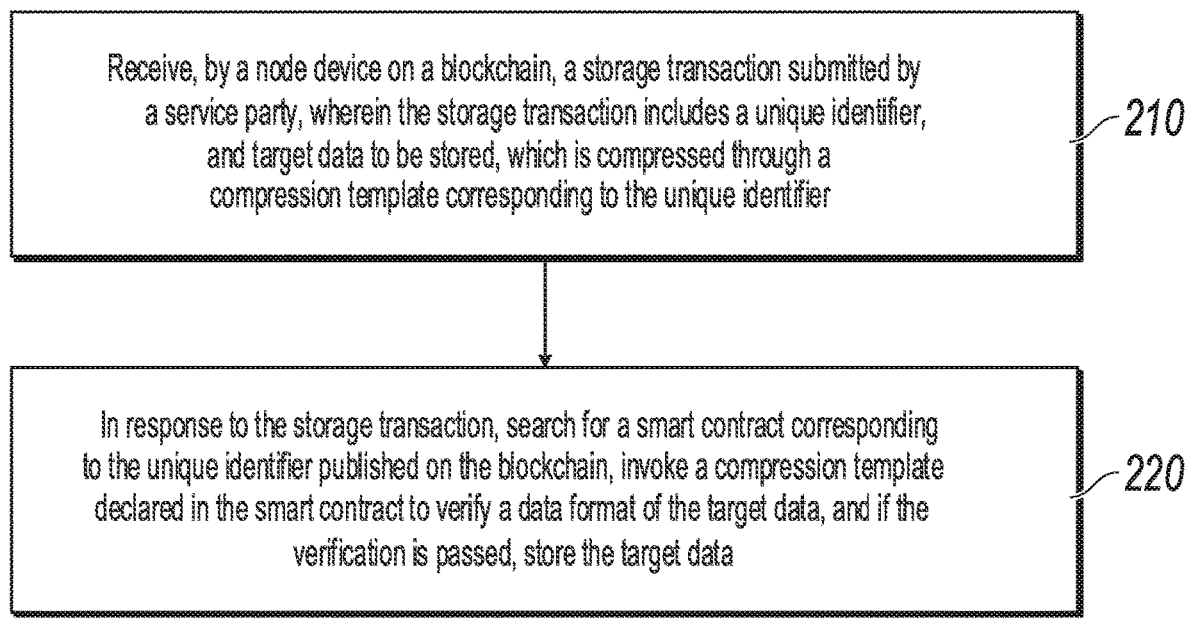
FIG. 2 is a flowchart illustrating a blockchain-based data compression method according to an embodiment of the present disclosure.

FIG. 2 is a flowchart illustrating a blockchain-based data compression method according to an embodiment of the present disclosure. The method is applied to a node device on a blockchain, and may include the following steps.

At step 210, the node device on the blockchain receives a storage transaction submitted by a service party, wherein the storage transaction includes a unique identifier and target data to be stored. In some embodiments, the target data is compressed through a compression template corresponding to the unique identifier;

At step 220, in response to the storage transaction, a smart contract that is corresponding to the unique identifier and that is published on the blockchain is searched for. A compression template declared in the smart contract is invoked to verify a data format of the target data. If the verification is passed, the target data is stored.

This example is different from the example shown in FIG. 1 in execution entity. In some embodiments, reference may be made to the description in the example of FIG. 1.

The service party may create the smart contract for service data verification. The smart contract is formed based on the compression template.

Generally, the smart contract needs to conform to smart contract specifications. Therefore, for the node device, the smart contract submitted by the service party may be examined.

In an example, the node device on the blockchain receives, from the service party, a creation transaction of a smart contract into which the compression template is assembled.

In response to the creation transaction, a smart contract audit logic declared in a smart audit contract published on the blockchain is invoked, a voting event is written in a transaction log. After an audit node on the blockchain monitors the voting event, a voting transaction is submitted to the smart audit contract. The smart audit contract summarizes the voting transaction to acquire an audit result of the smart contract.

If the audit result is passing, the smart contract is created on the blockchain, and the unique identifier of the smart contract is returned to the service party. That is, there is a one-to-one correspondence between the unique identifier and the smart contract.

In an example, the unique identifier may refer to a hash value acquired by performing a hash calculation on a unique content of the compression template declared in the smart contract. The hash value is also used as a smart contract address for storing the smart contract.

In addition to the hash value, any other identifier that has uniqueness may be also used as the unique identifier. For example, sequentially increasing IDs may be used for identification. For example, starting from ID=0, each time a smart contract is created, 1 is added to an initial ID as a unique identifier of the newly created smart contract.

For the target data that has been compressed locally based on the compression template in the service party and uploaded by the service party, the node device can verify the target data. When the data format of the target data conforms to the data format specified by the compression template, it can be determined to pass the verification, thereby storing the compressed target data.

Some embodiments of the present disclosure provide a blockchain-based data compression solution. The service party locally compresses the target data to be stored based on the compression template. Corresponding node device on the blockchain verifies the compressed data based on the smart contract corresponding to the compression template to ensure that the compressed data to be stored meets the requirement of the data format, thereby avoiding abnormal data such as garbled and misaligned data. In this way, through the compression template and the constraint of the smart contract to the format, data is compressed from a data source to reduce the amount of data.

As mentioned above, the service party may compress the target data and then store the compressed target data on the chain. In this way, the amount of data stored on the chain can be greatly reduced to decrease the storage resources required for data storage. However, because the data is compressed, after reading these compressed data, how to restore the compressed data into complete data also needs to be solved.

Figure 3:
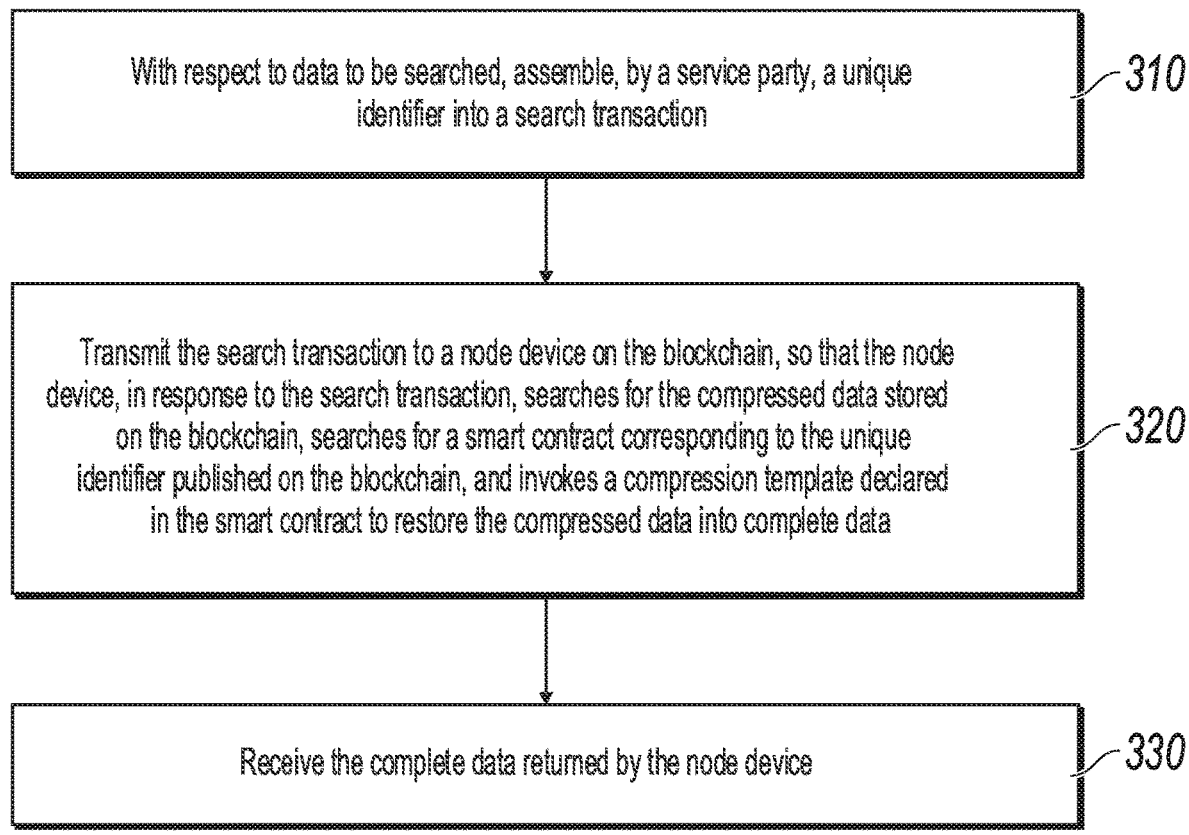
FIG. 3 is a flowchart illustrating a blockchain-based data searching method according to an embodiment of the present disclosure.

FIG. 3 is a flowchart illustrating a blockchain-based data searching method according to an embodiment of the present disclosure. The method is applied to a service party, and data stored on a blockchain is data compressed based on the example shown in FIG. 1. This example may include the following steps.

At step 310, with respect to data to be searched for, the service party assembles a unique identifier into a search transaction.

At step 320, the search transaction is transmitted to a node device on the blockchain. The node device, in response to the search transaction, searches for the compressed data stored on the blockchain, searches for a smart contract that is corresponding to the unique identifier and that is published on the blockchain, invokes a compression template declared in the smart contract to restore the compressed data into complete data.

At step 330, the complete data returned by the node device is received.

The service party, when needing to acquire the target data, may assemble the unique identifier corresponding to a data structure to which the target data belongs into the search transaction, that is, the search transaction includes the unique identifier.

In response to the search transaction, the node device may first search for the compressed data of the target data stored on the blockchain, and search for the smart contract corresponding to the unique identifier.

Here, there can be no absolute time sequence for execution of searching for the compressed data and searching for the smart contract. They may be executed simultaneously, or searching for the compressed data may be executed first, or searching for the smart contract may be executed first.

After retrieving the smart contract and the compressed data, the compression template declared in the smart contract needs to be invoked to restore the compressed data into the complete data.

In an example, the compression template records a compression rule of a self-describing structure. In this example, restoring the compressed data into the complete data may include: mapping self-defining data in the compressed data into the self-describing structure according to the compression rule, wherein an amount of the self-defining data is smaller than a data amount of the self-describing structure.

Still in the above example, for the target data, /username/ ZhangSan, since the data structure of the target data is an XML data structure, if it is defined in the XML compression template that /username/ is mapped to "1", the compressed target data will be changed to: 1 ZhangSan.

If the service party needs to acquire the target data, since what is stored in the blockchain is 1 ZhangSan, it may be necessary to restore the self-defining data to the self-describing structure. Since the XML compression template declared in the smart contract defines the mapping relationship between "/username/" and "1", the node device may convert the self-defining data "1" in the compressed data into the self-describing structure "/username/", that is, the restored complete data is /username/ ZhangSan. The meaning of the searched data, ZhangSan, is a username.

Some embodiments of the present disclosure provide a blockchain-based data searching solution. When the node device on the blockchain receives the search transaction from the service party, since the data stored on the blockchain is compressed data, it is possible to restore the compressed data into the complete data based on the compression template declared in the smart contract. In this way, based on the compression template declared in the smart contract, the compressed data stored is restored into the complete data and provided to the service party to ensure data correctness.

Figure 4:
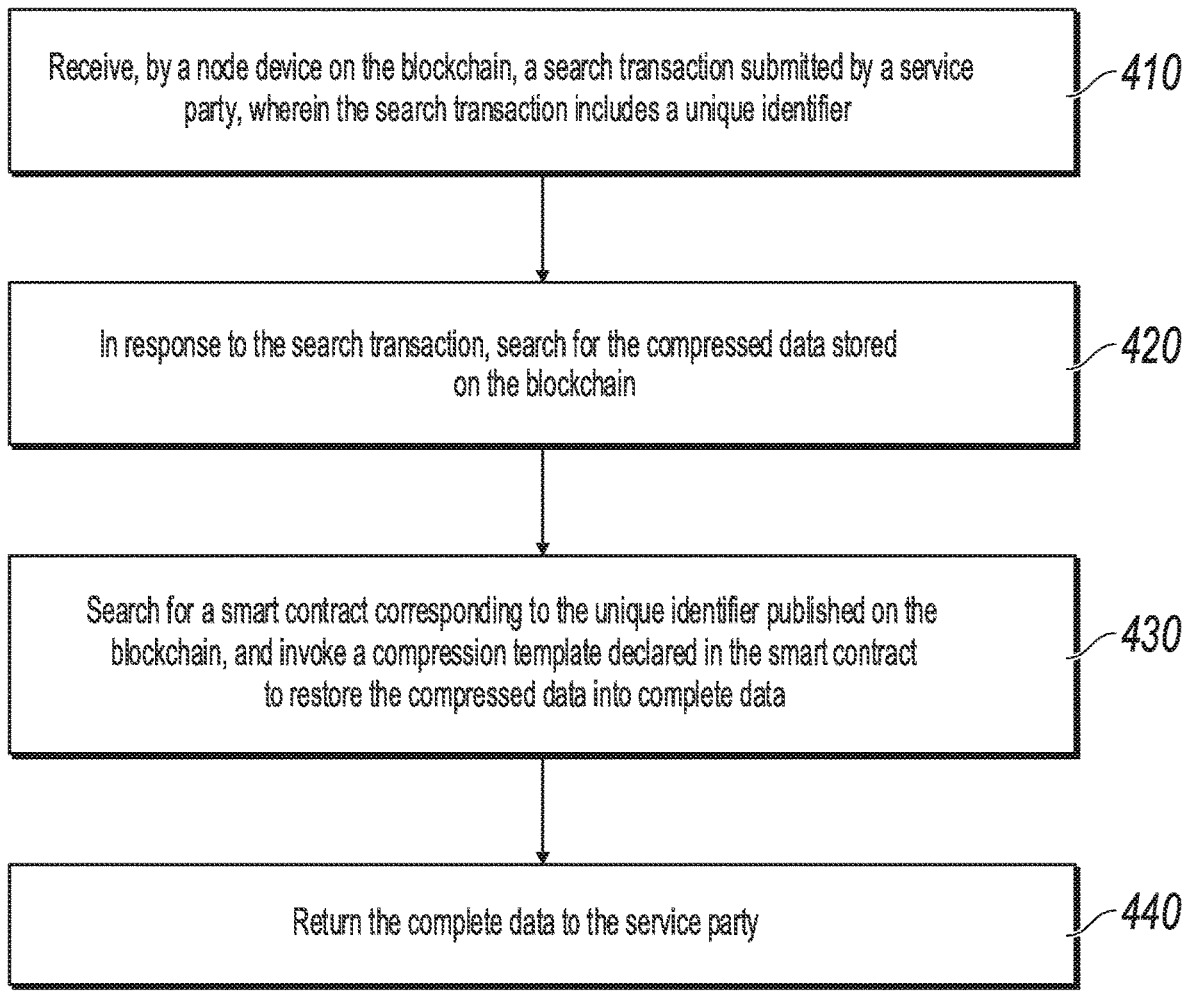
FIG. 4 is a flowchart illustrating a blockchain-based data searching method according to an embodiment of the present disclosure.

FIG. 4 is a flowchart illustrating a blockchain-based data searching method according to an embodiment of the present disclosure. The method is applied to a node device on a blockchain, and data stored on the blockchain is data compressed based on the example shown in FIG. 1. This example may include the following steps.

At step 410, the node device on the blockchain receives a search transaction submitted by a service party, wherein the search transaction includes a unique identifier.

At step 420, in response to the search transaction, the compressed data stored on the blockchain is searched for.

At step 430, a smart contract that is corresponding to the unique identifier and that is published on the blockchain is searched for, and a compression template declared in the smart contract is invoked to restore the compressed data into complete data;

At step 440, the complete data is returned to the service party.

This example is different from the example shown in FIG. 3 in execution entity. In some embodiments, reference may be made to the description in the example of FIG. 3.

The service party may initiate the search transaction to the node device on the blockchain to search for the target data stored on the blockchain, wherein the search transaction includes the unique identifier.

In response to the search transaction, the node device may first search for the compressed data of the target data stored on the blockchain, and search for the smart contract corresponding to the unique identifier.

Here, there can be no absolute time sequence for execution of searching for the compressed data and searching for the smart contract. They may be executed simultaneously, or searching for the compressed data may be executed first, or the searching for the smart contract may be executed first.

After retrieving the smart contract and the compressed data, the compression template declared in the smart contract needs to be invoked to restore the compressed data into the complete data.

In an example, the compression template records a compression rule of a self-describing structure. In this example, restoring the compressed data into the complete data may include: mapping self-defining data in the compressed data into the self-describing structure according to the compression rule, wherein an amount of the self-defining data is smaller than a data amount of the self-describing structure.

Continue with the above example, for the target data, /username/ ZhangSan, since the data structure of the target data is an XML, data structure, if it is defined in the XML compression template that /username/ is mapped to "1", the compressed target data will be changed to: 1 ZhangSan.

If the service party needs to acquire the target data, since what is stored in the blockchain is 1 ZhangSan, it may be necessary to restore the self-defining data to the self-describing structure. Since the XML compression template declared in the smart contract defines the mapping relationship between "/username/" and "1", the node device may convert the self-defining data "1" in the compressed data into the self-describing structure "/username/", that is, the restored complete data is /username/ ZhangSan. The meaning of the searched data, ZhangSan, is a username.

Some embodiments of the present disclosure provide a blockchain-based data searching solution. When the node device on the blockchain receives the search transaction from the service party, since the data stored on the blockchain is compressed data, it is possible to restore the compressed data into the complete data based on the compression template declared in the smart contract. In this way, based on the compression template declared in the smart contract, the compressed data stored is restored into the complete data and provided to the service party to ensure data correctness.

Figure 5:
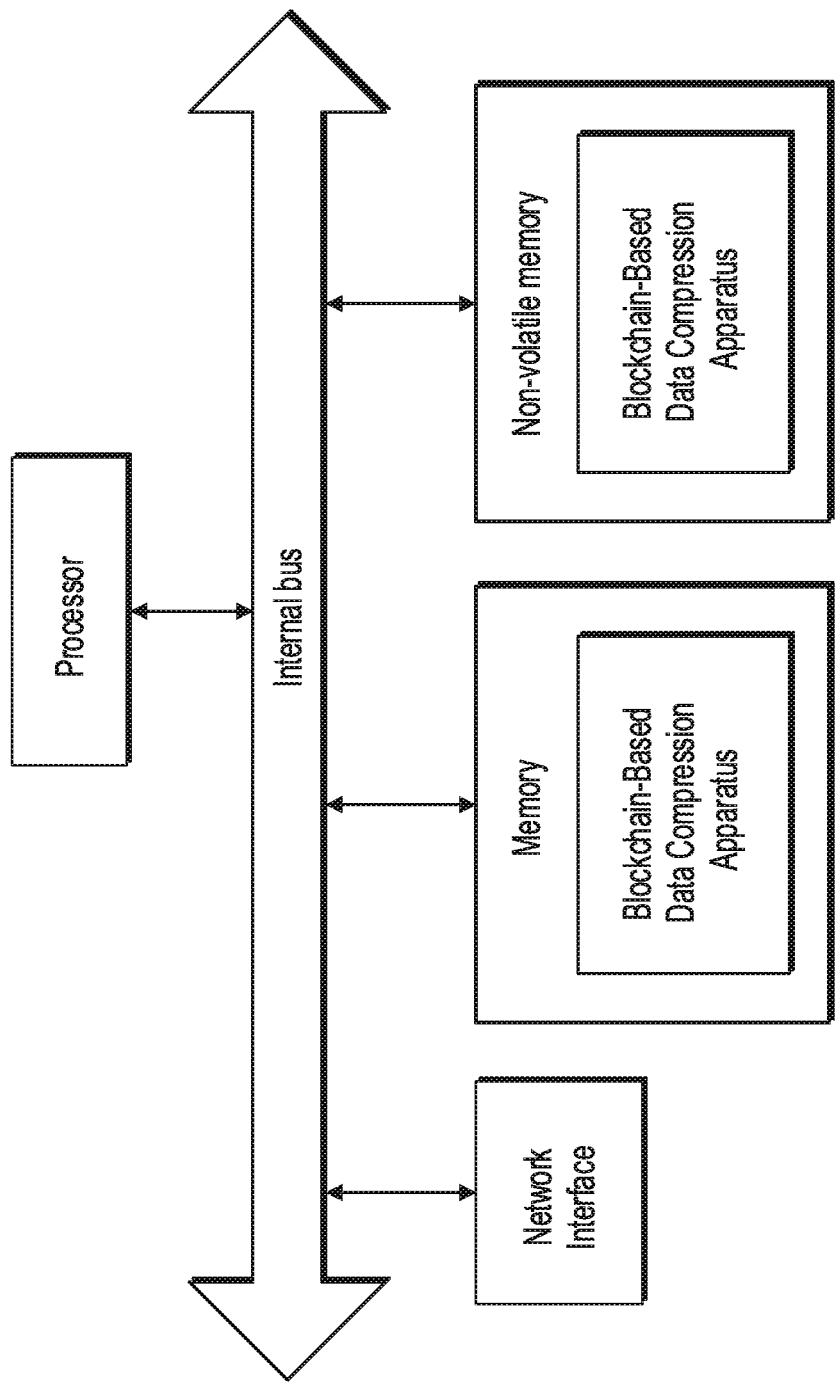
FIG. 5 is a hardware structural diagram illustrating a blockchain-based data compression apparatus according to an embodiment of the present disclosure.

Corresponding to the examples of a blockchain-based data compression method, this disclosure also provides examples of a blockchain-based data compression method apparatus. The apparatus examples may be implemented by software or by hardware or by a combination of software and hardware. Taking software implementation as an example, as a logical apparatus, it is formed by a processor of a device, where it is located, reading corresponding computer transaction program instructions in a non-volatile memory into a memory for execution. In terms of hardware, as shown in FIG. 5, which is a hardware structural diagram illustrating a device where a blockchain-based data compression apparatus according to an embodiment of the present disclosure is located, in addition to a processor, a network interface, a memory, and a non-volatile memory shown in FIG. 5, the device where the apparatus is located in the examples may usually further include other hardware according to the actual function of the blockchain-based data compression, which will not be described herein again.

Figure 6:
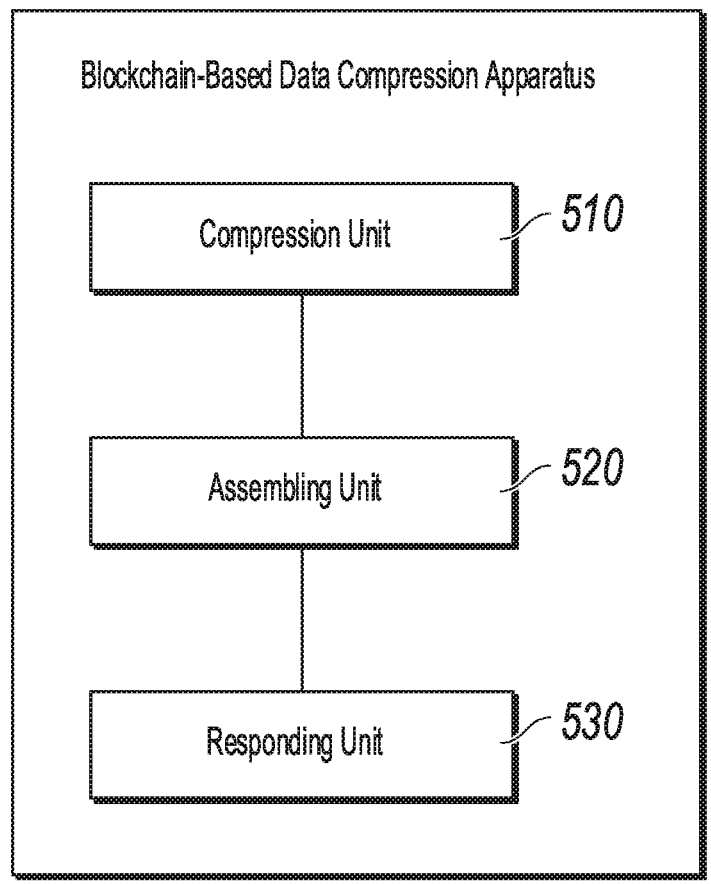
FIG. 6 is a schematic block diagram illustrating a blockchain-based data compression apparatus according to an embodiment of the present disclosure.

FIG. 6 is a schematic modular diagram illustrating a blockchain-based data compression apparatus according to an embodiment of the present disclosure. The apparatus corresponds to the example shown in FIG. 1, and is applied to a service party. The apparatus includes: a compression unit 510 configured to compress, by a service party, target data to be stored according to a preset compression template; an assembling unit 520 configured to assemble the compressed target data and a unique identifier of the compression template into a storage transaction; and a responding unit 530 configured to transmit the storage transaction to a node device on a blockchain, so that the node device, in response to the storage transaction, searches for a smart contract that is corresponding to the unique identifier and that is published on the blockchain, invokes a compression template declared in the smart contract to verify a data format of the target data, and if the verification is passed, stores the target data.

In some embodiments, the compression unit 510 includes: a determination subunit configured to determine a data structure of the target data to be stored; and a compression subunit configured to compress the target data according to a compression template corresponding to the data structure.

In some embodiments, the data structure of the target data includes a self-describing structure and substance data. In some embodiments, the self-describing structure is configured to represent a meaning expressed by the substance data. A compression rule of the self-describing structure can be recorded in the compression template. In some embodiments, the compression subunit compressing the target data includes: mapping the self-describing structure of the target data into self-defining data according to the compression rule. In some embodiments, an amount of the self-defining data is smaller than a data amount of the self-describing structure.

In some embodiments, the apparatus further includes: a transaction assembling subunit configured to assemble the compression template into a creation transaction of a smart contract; a smart contract creation subunit configured to transmit the creation transaction to the node device on the blockchain. The node device, in response to the creation transaction, invokes a smart contract audit logic declared in a smart audit contract published on the blockchain, writes a voting event in a transaction log, and after an audit node on the blockchain monitors the voting event, submits a voting transaction to the smart audit contract. The smart audit contract summarizes the voting transaction to acquire an audit result of the smart contract.

In some embodiments, the smart contract creation subunit is further configured to: if the audit result is passing, create the smart contract on the blockchain, and return the unique identifier of the smart contract to the service party.

In some embodiments, the unique identifier includes: a hash value acquired by performing a hash calculation on a unique content of the compression template declared in the smart contract.

Figure 7:
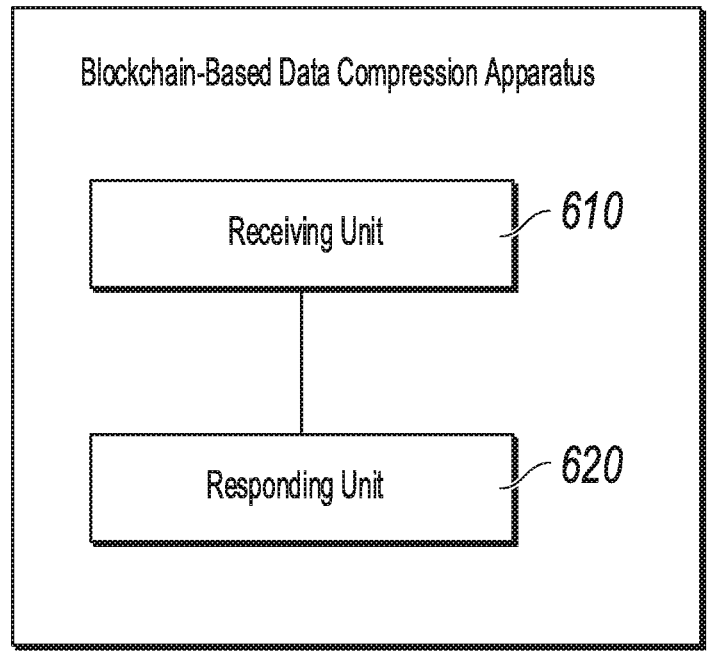
FIG. 7 is a schematic block diagram illustrating a blockchain-based data compression apparatus according to an embodiment of the present disclosure.

FIG. 7 is a schematic modular diagram illustrating a blockchain-based data compression apparatus according to an embodiments of the present disclosure. The apparatus corresponds to the example shown in FIG. 2, and is applied to a node device on a blockchain. The apparatus includes: a receiving unit 610 configured to receive, by a node device on a blockchain, a storage transaction submitted by a service party, wherein the storage transaction includes a unique identifier and target data to be stored, where the target data is compressed through a compression template corresponding to the unique identifier; a responding unit 620 configured to, in response to the storage transaction, search for a smart contract that is corresponding to the unique identifier and that is published on the blockchain, invoke a compression template declared in the smart contract to verify a data format of the target data, and if the verification is passed, store the target data.

The node device on the blockchain receives the storage transaction submitted by the service party, wherein the storage transaction includes the unique identifier and the target data to be stored, where the target data is compressed through the compression template corresponding to the unique identifier;

In response to the storage transaction, the smart contract that is corresponding to the unique identifier and that is published on the blockchain is searched, the compression template declared in the smart contract is invoked to verify the data format of the target data, and if the verification is passed, the target data is stored.

In some embodiments, the apparatus further includes: a reception subunit configured to receive, from the service party, creation transaction of a smart contract into which the compression template is assembled; a creation subunit configured to, in response to the creation transaction, invoke a smart contract audit logic declared in a smart audit contract published on the blockchain, write a voting event in a transaction log, and after an audit node on the blockchain monitors the voting event, submit a voting transaction to the smart audit contract; summarize, by the smart audit contract, the voting transaction to acquire an audit result of the smart contract.

In some embodiments, the creation subunit is further configured to: if the audit result is passing, create the smart contract on the blockchain, and return the unique identifier of the smart contract to the service party.

In some embodiments, the unique identifier includes: a hash value acquired by performing a hash calculation on a unique content of the compression template declared in the smart contract.

Figure 8:
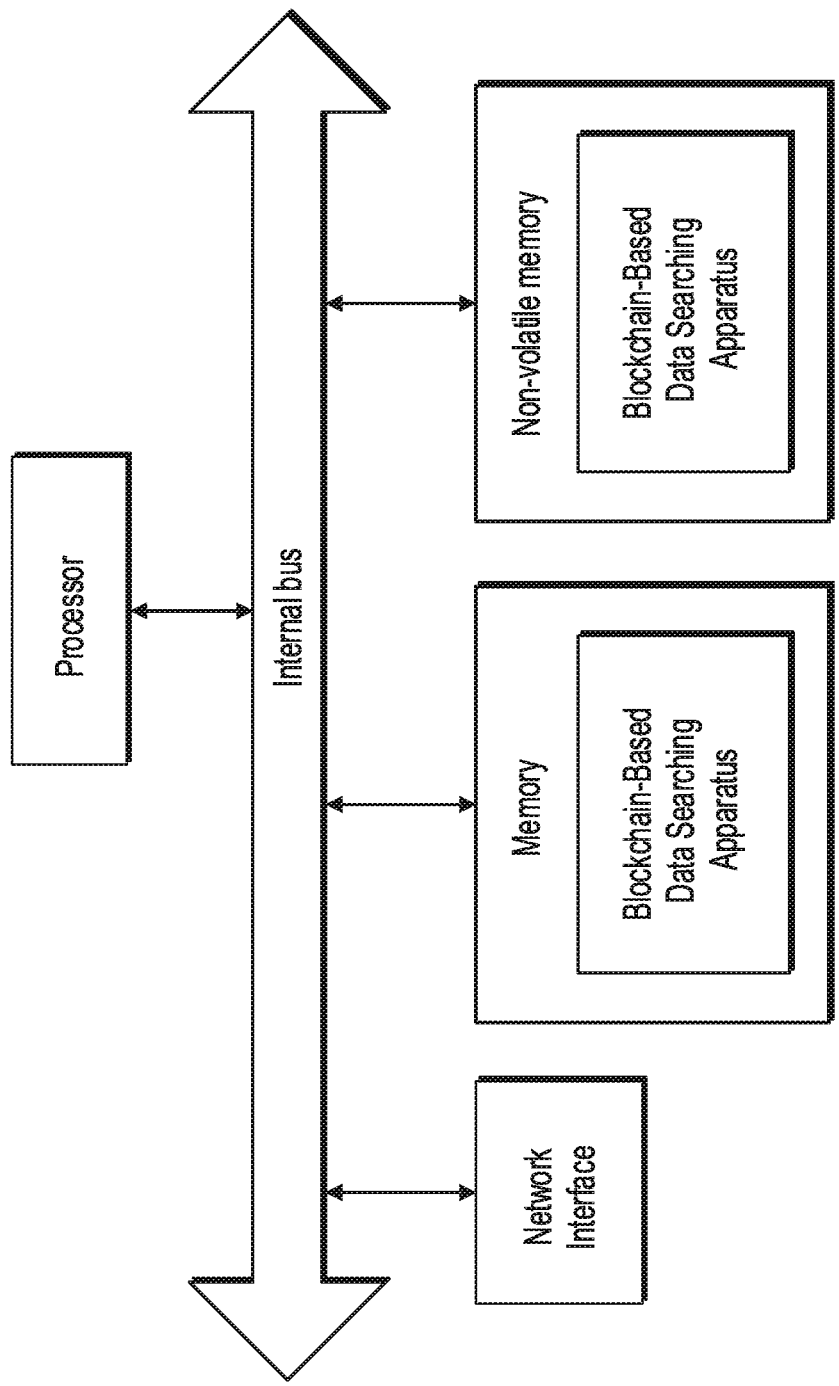
FIG. 8 is a hardware structural diagram illustrating a blockchain-based data searching apparatus according to an embodiment of the present disclosure.

Corresponding to the examples of the blockchain-based data searching method, this disclosure also provides examples of the blockchain-based data searching apparatus. The apparatus examples may be implemented by software or by hardware or by a combination of software and hardware. Taking software implementation as an example, as a logical apparatus, it is formed by a processor of a device, where it is located, reading corresponding computer transaction program instructions in a non-volatile memory into a memory for execution. In terms of hardware, as shown in FIG. 8, which is a hardware structural diagram illustrating a device where a blockchain-based data searching apparatus according to an example of the present disclosure is located, in addition to a processor, a network interface, a memory, and a non-volatile memory shown in FIG. 8, the device where the apparatus is located in the examples may usually further include other hardware according to the actual function of the blockchain-based data search, which will not be described herein again.

Figure 9:
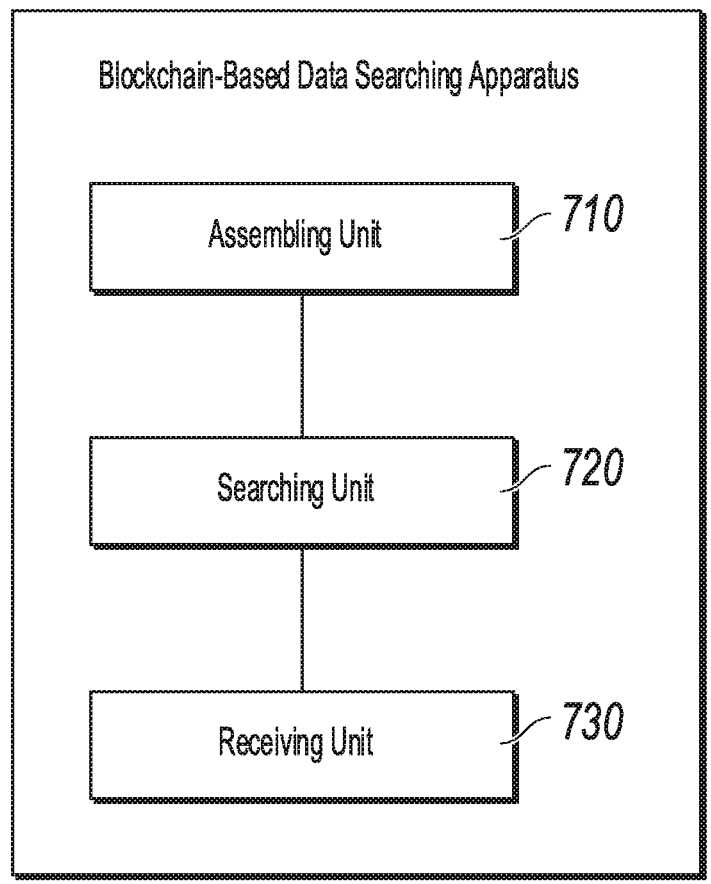
FIG. 9 is a schematic block diagram illustrating a blockchain-based data searching apparatus according to an embodiment of the present disclosure.

FIG. 9 is a schematic modular diagram illustrating a blockchain-based data compression apparatus according to an embodiment of the present disclosure. The apparatus corresponds to the example shown in FIG. 3, and is applied to a service party. Data stored on a blockchain is data compressed based on the blockchain-based data compression method as described above. The apparatus includes: an assembling unit 710 configured to, with respect to data to be searched, assemble, by a service party, a unique identifier into a search transaction; a searching unit 720 configured to transmit the search transaction to a node device on the blockchain, so that the node device, in response to the search transaction, searches for the compressed data stored on the blockchain, searches for a smart contract that is corresponding to the unique identifier and that is published on the blockchain, and invokes a compression template declared in the smart contract to restore the compressed data into complete data; a receiving unit 730 configured to receive the complete data returned by the node device.

In some embodiments, the compression template records a compression rule of a self-describing structure. The searching unit 720 restoring the compressed data into the complete data can include: mapping self-defining data in the compressed data into the self-describing structure according to the compression rule, wherein an amount of the self-defining data is smaller than a data amount of the self-describing structure.

Figure 10:
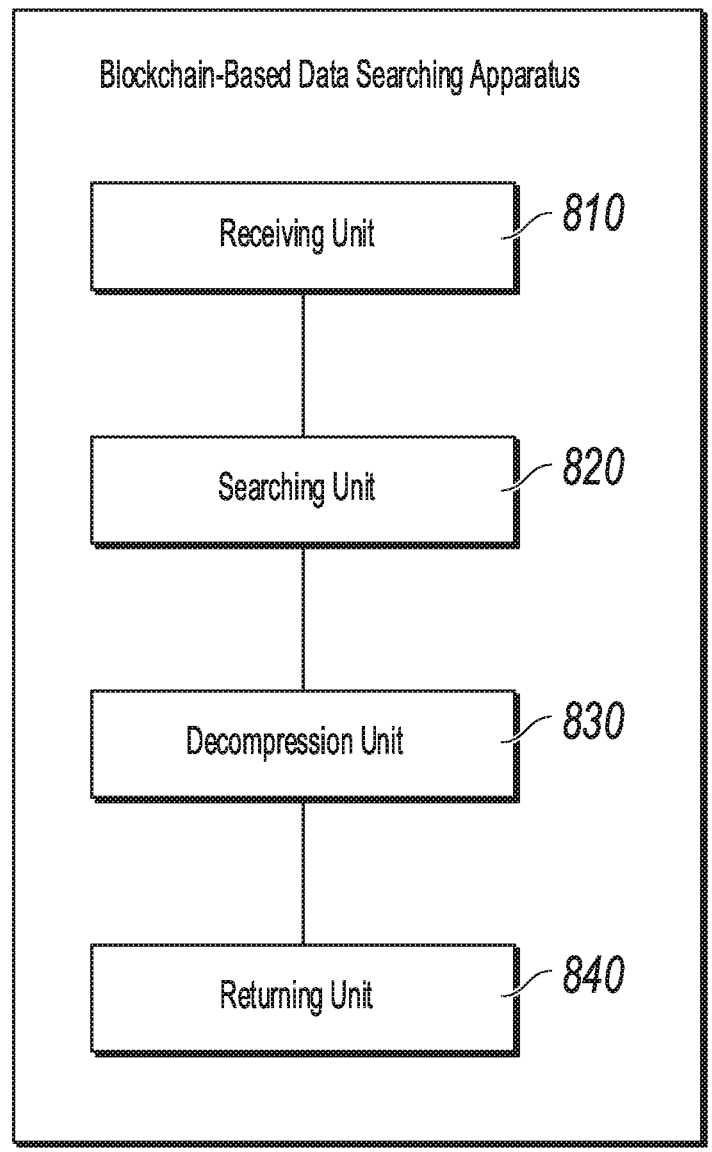
FIG. 10 is a schematic block diagram illustrating a blockchain-based data searching apparatus according to an embodiment of the present disclosure.

FIG. 10 is a schematic modular diagram illustrating a blockchain-based data compression apparatus according to an embodiment of the present disclosure. The apparatus corresponds to the example shown in FIG. 4, and is applied to a node device on a blockchain. Data stored on the blockchain is data compressed based on the blockchain-based data compression method as described above. The apparatus includes: a receiving unit 810 configured to receive, by a node device on the blockchain, a search transaction submitted by a service party, wherein the search transaction includes a unique identifier; a searching unit 820 configured to, in response to the search transaction, search for the compressed data stored on the blockchain; a decompression unit 830 configured to search for a smart contract that is corresponding to the unique identifier and that is published on the blockchain, and invoke a compression template declared in the smart contract to restore the compressed data into complete data; a returning unit 840 configured to return the complete data to the service party.

In some embodiments, the compression template records a compression rule of a self-describing structure. The decompression unit 830 restoring the compressed data into the complete data can include: mapping self-defining data in the compressed data into the self-describing structure according to the compression rule, wherein an amount of the self-defining data is smaller than a data amount of the self-describing structure.

The system, apparatus, module, or unit illustrated in the above examples may be implemented by using a computer chip or an entity, or by using a product having a certain function. A typical implementation device is a computer, and the form of the computer may be a personal computer, a laptop computer, a cellular phone, a camera phone, a smartphone, a personal digital assistant, a media player, a navigation device, an email receiving and sending device, a game console, a tablet computer, a wearable device, or any combination of these devices.

For details about the implementation process of functions and roles of units in the above apparatuses, reference may be made to the implementation process of corresponding steps in the above methods, which will not be described herein again.

For the apparatus examples, since they basically correspond to the method examples, reference may be made to the partial description of the method examples. The apparatus examples described above are merely illustrative, wherein the units described as separate components may or may not be physically separated, and the components displayed as units may or may not be physical units, i.e., may be located in one place or may be distributed to multiple network units.

Some or all of the modules may be selected according to actual needs to achieve the objectives of solutions in the present disclosure. Those of ordinary skill in the art can understand and implement the present disclosure without any creative effort.

FIG. 6 describes the internal functional modules and structure of a blockchain-based data compression apparatus, and its actual execution entity may be an electronic device, including: a processor; and a memory for storing processor executable instructions. The processor is configured to: compress, by a service party, target data to be stored according to a preset compression template; assemble the compressed target data and a unique identifier of the compression template into a storage transaction; and transmit the storage transaction to a node device on a blockchain, so that the node device, in response to the storage transaction, searches for a smart contract that is corresponding to the unique identifier and that is published on the blockchain, invokes a compression template declared in the smart contract to verify a data format of the target data, and if the verification is passed, stores the target data.

FIG. 7 describes the internal functional modules and structure of a blockchain-based data compression apparatus, and its actual execution entity may be an electronic device, including: a processor; and a memory for storing processor executable instructions. The processor is configured to: receive, by a node device on a blockchain, a storage transaction submitted by a service party, wherein the storage transaction includes a unique identifier, and target data to be stored, which is compressed through a compression template corresponding to the unique identifier; in response to the storage transaction, search for a smart contract that is corresponding to the unique identifier and that is published on the blockchain, invoke a compression template declared in the smart contract to verify a data format of the target data, and if the verification is passed, store the target data.

FIG. 9 describes the internal functional modules and structure of a blockchain-based data searching apparatus, and its actual execution entity may be an electronic device, including: a processor; and a memory for storing processor executable instructions. The processor is configured to: with respect to data to be searched, assemble, by a service party, a unique identifier into a search transaction, wherein data stored on a blockchain is data compressed based on any of the blockchain-based data compression methods as described above; transmit the search transaction to a node device on the blockchain, so that the node device, in response to the search transaction, searches for the compressed data stored on the blockchain, searches for a smart contract that is corresponding to the unique identifier and that is published on the blockchain, and invokes a compression template declared in the smart contract to restore the compressed data into complete data; receive the complete data returned by the node device.

FIG. 10 describes the internal functional modules and structure of a blockchain-based data searching apparatus, and its actual execution entity may be an electronic device, including: a processor; and a memory for storing processor executable instructions. The processor is configured to: receive, by a node device on a blockchain, a search transaction submitted by a service party, wherein the search transaction includes a unique identifier; data stored on the blockchain is data compressed based on any of the blockchain-based data compression methods as described above; in response to the search transaction, search for the compressed data stored on the blockchain; search for a smart contract that is corresponding to the unique identifier and that is published on the blockchain, and invoke a compression template declared in the smart contract to restore the compressed data into complete data; return the complete data to the service party.

In examples of the electronic device, it should be understood that the processor may be a Central Processing Unit (CPU), or other general-purpose processor, a Digital Signal Processor (DSP), an Application Specific Integrated Circuit (ASIC), etc. The general-purpose processor may be a microprocessor or the processor may be any conventional processor and the like. The aforementioned memory may be a read-only memory (ROM), a Random access memory (RAM), a flash memory, a hard disk, or a solid state disk. The steps of the method disclosed in combination with the examples of the present disclosure may be directly performed by a hardware processor, or may be performed by a combination of hardware and software modules in a processor.

The examples in this disclosure are described in a progressive manner, and the same or similar parts between the examples may refer to each other. Each example focuses on differences from other examples. In particular, with respect to the examples of the electronic device, since they are basically similar to the method examples, the description thereof is relatively simple. For the related parts, reference may be made to the description of the method examples.

Other embodiments of the present disclosure will be readily apparent to those skilled in the art after considering the disclosure and practicing the methods disclosed herein. The present disclosure is intended to cover any variations, uses, or adaptations of the present disclosure, which follow the general principle of the present disclosure and include common knowledge or conventional technical means in the art that are not disclosed in the present disclosure. The disclosure and examples are to be regarded as illustrative only. The true scope and spirit of the present disclosure are pointed out by the following claims.

It is to be understood that the present disclosure is not limited to the precise structures that have described and shown in the drawings, and various modifications and changes can be made without departing from the scope thereof. The scope of the disclosure is to be limited only by the appended claims.

What is claimed is:
1. A computer-implemented method comprising:
receiving, by a node device on a blockchain, storage transaction data;
wherein the storage transaction data comprises compressed target data to be stored and a unique identifier of a smart contract published on the blockchain, wherein the compressed target data comprises target data compressed according to a preset compression template, and wherein the smart contract comprises the preset compression template;
searching for the smart contract published on the blockchain based on the unique identifier;
invoking the preset compression template of the smart contract to determine that a data format of the target data conforms to a data format specified by the preset compression template, wherein the preset compression template comprises a rule for compression of data having the data format of the target data; and
in response to determining that the data format of the target data conforms to the data format specified by the preset compression template, storing the compressed target data.

2. The computer-implemented method of claim 1, wherein a data structure of the target data comprises a self-describing structure and substance data, wherein the self-describing structure is configured to represent a meaning expressed by the substance data, and wherein the target data is compressed based on a mapping between the self-describing structure of the target data and self-defining data according to the rule for of data having the data format of the target data, wherein an amount of the self-defining data is smaller than a data amount of the self-describing structure.

3. The computer-implemented method of claim 1, further comprising,. prior to receiving the storage transaction data:
    receiving smart contract creation data comprising the preset compression template;
    invoking a smart contract audit logic declared in a smart audit contract published on the blockchain;
    writing a voting event in a transaction log; and
    after an audit node on the blockchain monitors the voting event, submitting a voting transaction to the smart audit contract, wherein the smart audit contract summarizes the voting transaction to acquire an audit result of the smart contract.

4. The computer-implemented method of claim 3, further comprising:
    in response to the audit result indicating a passing vote, generating the unique identifier of the smart contract, and
    creating the smart contract on the blockchain.

5. The computer-implemented method of claim 4, wherein the unique identifier comprises a hash value acquired by performing a hash calculation on a unique content of the preset compression template.

6. The computer-implemented method of claim 1, comprising:
    receiving, by the node device, from a service party, a search transaction, the search transaction comprising the unique identifier;
    searching for the compressed target data stored on the blockchain;
    invoking the preset compression template of the smart contract to restore the compressed target data to the target data; and
    returning the target data to the service party.

7. A non-transitory, computer-readable medium storing one or more instructions executable by a computer system to perform operations comprising:
    receiving, by a node device on a blockchain, storage transaction data;
        wherein the storage transaction data comprises compressed target data to be stored and a unique identifier of a smart contract published on the blockchain, wherein the compressed target data comprises target data compressed according to a preset compression template, and wherein the smart contract comprises the preset compression template;
        searching for the smart contract published on the blockchain based on the unique identifier;
        invoking the preset compression template of the smart contract to determine that a data format of the target data conforms to a data format specified by the preset compression template, wherein the preset compression template comprises a rule for compression of data having the data format of the target data; and
        in response to determining that the data format of the target data conforms to the data format specified by the preset compression template, storing the compressed target data.

8. The non-transitory, computer-readable medium of claim 7, wherein a data structure of the target data comprises a self-describing structure and substance data, wherein the self-describing structure is configured to represent a meaning expressed by the substance data, and wherein the target data is compressed based on a mapping between the self-describing structure of the target data and self-defining data according to the rule for compression of data having the data format of the target data, wherein an amount of the self-defining data is smaller than a data amount of the self-describing structure.

9. The non-transitory, computer-readable medium of claim 7, wherein the operations further comprise, prior to receiving the storage transaction data:
    receiving smart contract creation data comprising the preset compression template;
    invoking a smart contract audit logic declared in a smart audit contract published on the blockchain;
    writing a voting event in a transaction log; and
    after an audit node on the blockchain monitors the voting event, submitting a voting transaction to the smart audit contract, wherein the smart audit contract summarizes the voting transaction to acquire an audit result of the smart contract.

10. The non-transitory, computer-readable medium of claim 9, wherein the operations further comprise:
    in response to the audit result indicating a passing vote, generating the unique identifier of the smart contract, and
    creating the smart contract on the blockchain.

11. The non-transitory, computer-readable medium of claim 10, wherein the unique identifier comprises a hash value acquired by performing a hash calculation on a unique content of the preset compression template.

12. The non-transitory, computer-readable medium of claim 7, wherein the operations comprise:
    receiving, by the node device, from a service party, a search transaction, the search transaction comprising the unique identifier;
    searching for the compressed target data stored on the blockchain;
    invoking the preset compression template of the smart contract to restore the compressed target data to the target data; and
    returning the target data to the service party.

13. A computer-implemented system, comprising:
    one or more computers; and
    one or more computer memory devices interoperably coupled with the one or more computers and having tangible, non-transitory, machine-readable media storing one or more instructions that, when executed by the one or more computers, perform one or more operations comprising:
        receiving, by a node device on a blockchain, storage transaction data;
        wherein the storage transaction data comprises compressed target data to be stored and a unique identifier of a smart contract published on the blockchain, wherein the compressed target data comprises target data compressed according to a preset compression template, and wherein the smart contract comprises the preset compression template;
        searching for the smart contract published on the blockchain based on the unique identifier;
        invoking the preset compression template of the smart contract to determine that a data format of the target data conforms to a data format specified by the preset compression template, wherein the preset compression template comprises a rule for compression of data having the data format of the target data; and in response to determining that the data format of the target data conforms to the data format specified by the preset compression template, storing the compressed target data.

14. The computer-implemented system of claim 13, wherein a data structure of the target data comprises a self-describing structure and substance data, wherein the self-describing structure is configured to represent a meaning expressed by the substance data, and wherein the target data is compressed based on a mapping between the self-describing structure of the target data and self-defining data according to the rule for compression of data having the data format of the target data, wherein an amount of the self-defining data is smaller than a data amount of the self-describing structure.

15. The computer-implemented system of claim 13, wherein the operations further comprise, prior to receiving the storage transaction data:

receiving smart contract creation data comprising the preset compression template;

invoking a smart contract audit logic declared in a smart audit contract published on the blockchain;

writing a voting event in a transaction log; and after an audit node on the blockchain monitors the voting event, submitting a voting transaction to the smart audit contract, wherein the smart audit contract summarizes the voting transaction to acquire an audit result of the smart contract.

16. The computer-implemented system of claim 15, wherein the operations further comprise:

in response to the audit result indicating a passing vote, generating the unique identifier of the smart contract, and creating the smart contract on the blockchain.

17. The computer-implemented system of claim 16, wherein the unique identifier comprises a hash value acquired by performing a hash calculation on a unique content of the preset compression template.

18. The computer-implemented system of claim 13, wherein the operations comprise:

receiving, by the node device, from a service party, a search transaction, the search transaction comprising the unique identifier;

searching for the compressed target data stored on the blockchain;

invoking the preset compression template of the smart contract to restore the compressed target data to the target data; and returning the target data to the service party.

* * * * *

UNITED STATES PATENT AND TRADEMARK OFFICE
CERTIFICATE OF CORRECTION

PATENT NO. : 10,795,882 B2  
APPLICATION NO. : 16/786794  
DATED : October 6, 2020  
INVENTOR(S) : Long Cheng, Yanpeng Li and Boyan Jia Page 1 of 1

It is certified that error appears in the above-identified patent and that said Letters Patent is hereby corrected as shown below:

In the Claims

Column 17/Line 8, In Claim 2, after "rule for" insert -- compression --.

Column 17/Line 12, In Claim 3, delete "comprising,." insert -- comprising, --, therefor.

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*